(12) United States Patent
Shin

(10) Patent No.: US 10,102,900 B2
(45) Date of Patent: Oct. 16, 2018

(54) MEMORY DEVICE WITH SEPARATE READ ACTIVE SIGNAL AND WRITE ACTIVE SIGNAL HAVING DIFFERENT ACTIVATION PERIODS USED FOR WORD LINE SELECTION DURING READ AND WRITE OPERATION

(71) Applicant: SK hynix Inc., Icheon-si, Gyeonggi-do (KR)

(72) Inventor: Sun Hye Shin, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/584,591

(22) Filed: May 2, 2017

(65) Prior Publication Data
US 2018/0144789 A1    May 24, 2018

(30) Foreign Application Priority Data
Nov. 24, 2016  (KR) ...................... 10 2016 015 7503

(51) Int. Cl.
| | |
|---|---|
| G11C 11/419 | (2006.01) |
| G11C 7/22 | (2006.01) |
| G11C 11/413 | (2006.01) |
| G11C 5/02 | (2006.01) |
| G11C 13/00 | (2006.01) |
| G06F 1/26 | (2006.01) |
| G11C 5/14 | (2006.01) |

(52) U.S. Cl.
CPC .............. *G11C 11/419* (2013.01); *G06F 1/26* (2013.01); *G11C 5/02* (2013.01); *G11C 5/148* (2013.01); *G11C 7/22* (2013.01); *G11C 11/413* (2013.01); *G11C 13/0069* (2013.01); *G11C 2207/2227* (2013.01); *G11C 2213/53* (2013.01)

(58) Field of Classification Search
CPC ............................ G11C 13/0069; G11C 5/148
See application file for complete search history.

(56) References Cited

U.S. PATENT DOCUMENTS

| | | | | |
|---|---|---|---|---|
| 4,996,671 A | * | 2/1991 | Suzuki ................. | G11C 7/1048 365/203 |
| 5,307,314 A | * | 4/1994 | Lee ........................ | G11C 11/406 365/189.04 |
| 5,835,436 A | * | 11/1998 | Ooishi ..................... | G11C 7/10 365/230.03 |
| 5,909,407 A | * | 6/1999 | Yamamoto ............... | G11C 8/00 365/189.05 |
| 6,028,810 A | * | 2/2000 | Ooishi ..................... | G11C 7/10 365/230.03 |

(Continued)

FOREIGN PATENT DOCUMENTS

| | | |
|---|---|---|
| KR | 1020010005089 A | 1/2001 |
| KR | 1020090104309 A | 10/2009 |

*Primary Examiner* — Anthan Tran
*Assistant Examiner* — Mushfique Siddique
(74) *Attorney, Agent, or Firm* — William Park & Associates Ltd.

(57) ABSTRACT

A semiconductor device may include a word line selector configured to generate an active signal for selecting a word line, based on a row address. The active signal may be divided into a read active signal generated based on a read command and a write active signal generated based on a write command.

8 Claims, 5 Drawing Sheets

(56) References Cited

U.S. PATENT DOCUMENTS

| | | | | |
|---|---|---|---|---|
| 6,130,846 A * | 10/2000 | Hori | G11C 7/12 | 365/203 |
| 6,175,532 B1 * | 1/2001 | Ooishi | G11C 7/10 | 365/189.05 |
| 6,208,563 B1 * | 3/2001 | Naritake | G11C 7/1018 | 365/189.02 |
| 6,288,928 B1 * | 9/2001 | Shinozaki | G11C 7/1072 | 365/190 |
| 6,477,109 B2 * | 11/2002 | Furutani | G11C 7/1072 | 365/189.14 |
| 6,532,184 B2 * | 3/2003 | Chun | G11C 7/12 | 365/194 |
| 7,200,061 B2 * | 4/2007 | Sekiguchi | G11C 5/063 | 257/E21.656 |
| 7,266,030 B2 * | 9/2007 | Do | G11C 7/065 | 365/145 |
| 7,304,910 B1 * | 12/2007 | Hanzawa | G11C 7/1012 | 365/190 |
| 7,349,266 B2 * | 3/2008 | Ramaraju | G11C 7/1051 | 365/189.011 |
| 7,525,857 B2 * | 4/2009 | Kim | G11C 7/1048 | 365/189.09 |
| 7,619,935 B2 * | 11/2009 | Kim | G11C 7/1051 | 365/189.02 |
| 7,649,796 B2 * | 1/2010 | Okuda | G11C 11/406 | 365/195 |
| 7,969,765 B2 * | 6/2011 | Sekiguchi | G11C 5/063 | 365/149 |
| 8,797,823 B2 * | 8/2014 | Connolly | G06F 17/5059 | 365/193 |
| 8,908,447 B2 * | 12/2014 | Lee | G11C 11/4091 | 365/189.07 |
| 9,036,429 B2 * | 5/2015 | Hah | G11C 7/00 | 365/185.18 |
| 9,275,722 B2 * | 3/2016 | Ji | G11C 7/1048 | |
| 9,508,418 B1 * | 11/2016 | Lee | G11C 11/409 | |
| 9,564,195 B2 * | 2/2017 | Ji | G11C 8/18 | |
| 9,741,426 B2 * | 8/2017 | Park | G11C 11/4091 | |
| 9,755,626 B2 * | 9/2017 | Lee | G11C 5/025 | |
| 2002/0001235 A1 * | 1/2002 | Sawada | G11C 7/1078 | 365/191 |
| 2002/0041536 A1 * | 4/2002 | Tomita | G11C 8/10 | 365/189.14 |
| 2003/0021174 A1 * | 1/2003 | Lee | G11C 7/065 | 365/205 |
| 2004/0042334 A1 * | 3/2004 | Sasaki | G11C 7/103 | 365/236 |
| 2004/0088475 A1 * | 5/2004 | Streif | G11C 7/1021 | 711/105 |
| 2004/0190326 A1 * | 9/2004 | Shigenami | G11C 11/406 | 365/146 |
| 2005/0029551 A1 * | 2/2005 | Atwood | G11C 7/1039 | 257/208 |
| 2005/0057987 A1 * | 3/2005 | Fujimoto | G11C 7/12 | 365/205 |
| 2006/0092735 A1 * | 5/2006 | Do | G11C 7/065 | 365/207 |
| 2007/0070793 A1 * | 3/2007 | Do | G11C 7/1051 | 365/233.1 |
| 2007/0230258 A1 * | 10/2007 | Kim | G11C 7/08 | 365/189.11 |
| 2008/0304354 A1 * | 12/2008 | Do | G11C 7/1078 | 365/233.19 |
| 2010/0202189 A1 * | 8/2010 | Jung | G11C 7/02 | 365/149 |
| 2010/0315893 A1 * | 12/2010 | Hong | G11C 7/1048 | 365/203 |
| 2011/0103123 A1 * | 5/2011 | Nakaoka | G11C 11/4074 | 365/63 |
| 2011/0292709 A1 * | 12/2011 | Takayama | G11C 7/08 | 365/72 |
| 2012/0008446 A1 * | 1/2012 | Kim | G11C 7/1048 | 365/203 |
| 2014/0028280 A1 * | 1/2014 | Yamamoto | G05F 3/02 | 323/312 |
| 2014/0140124 A1 * | 5/2014 | Kang | G11C 13/004 | 365/148 |
| 2014/0211545 A1 * | 7/2014 | Nagata | G11C 11/4094 | 365/149 |
| 2015/0127884 A1 * | 5/2015 | Ji | G11C 7/1048 | 711/103 |
| 2015/0262650 A1 * | 9/2015 | Okahiro | G11C 11/4091 | 365/189.011 |
| 2016/0163359 A1 * | 6/2016 | Kim | G11C 5/025 | 365/72 |
| 2016/0163368 A1 * | 6/2016 | Ji | G11C 8/18 | 365/189.05 |
| 2017/0271026 A1 * | 9/2017 | Park | G11C 11/40615 | |
| 2017/0287549 A1 * | 10/2017 | Lee | G11C 11/40618 | |

* cited by examiner

MEMORY DEVICE WITH SEPARATE READ ACTIVE SIGNAL AND WRITE ACTIVE SIGNAL HAVING DIFFERENT ACTIVATION PERIODS USED FOR WORD LINE SELECTION DURING READ AND WRITE OPERATION

CROSS-REFERENCES TO RELATED APPLICATION

The present application claims priority under 35 U.S.C. § 119(a) to Korean application number 10-2016-0157503, filed on Nov. 24, 2016, in the Korean Intellectual Property Office, which is incorporated herein by reference in its entirety.

BACKGROUND

1. Technical Field

Various embodiments may generally relate to a semiconductor device and a semiconductor system including the same, and more particularly, to a read operation and a write operation.

2. Related Art

In order to perform a read operation or write operation, an active signal for activating a word line is applied. The same active signal for activating the word line is applied without distinguishing between a read operation and a write operation.

In a semiconductor device, however, a part which is operated during a read operation may be different from a part which is operated during a write operation. In this case, when a common active signal is used, a part irrelevant to the read operation or write operation may be operated to cause unnecessary current consumption.

SUMMARY

In an embodiment of the present disclosure, a semiconductor system may be provided. In an embodiment of the present disclosure, a write operation method of a semiconductor device may be provided. In an embodiment of the present disclosure, a read operation method of a semiconductor device may be provided. In an embodiment of the present disclosure, a semiconductor device may be provided. The semiconductor device may include a word line selector configured to generate an active signal for selecting a word line, based on a row address. The active signal may be divided into a read active signal generated based on a read command and a write active signal generated based on a write command.

DETAILED DESCRIPTION

Hereinafter, various embodiments of the present disclosure will be described below with reference to the accompanying drawings through examples of embodiments.

Various embodiments may be directed to a semiconductor device capable of generating active signals suitable for a read operation and a write operation, respectively.

Figure 1:
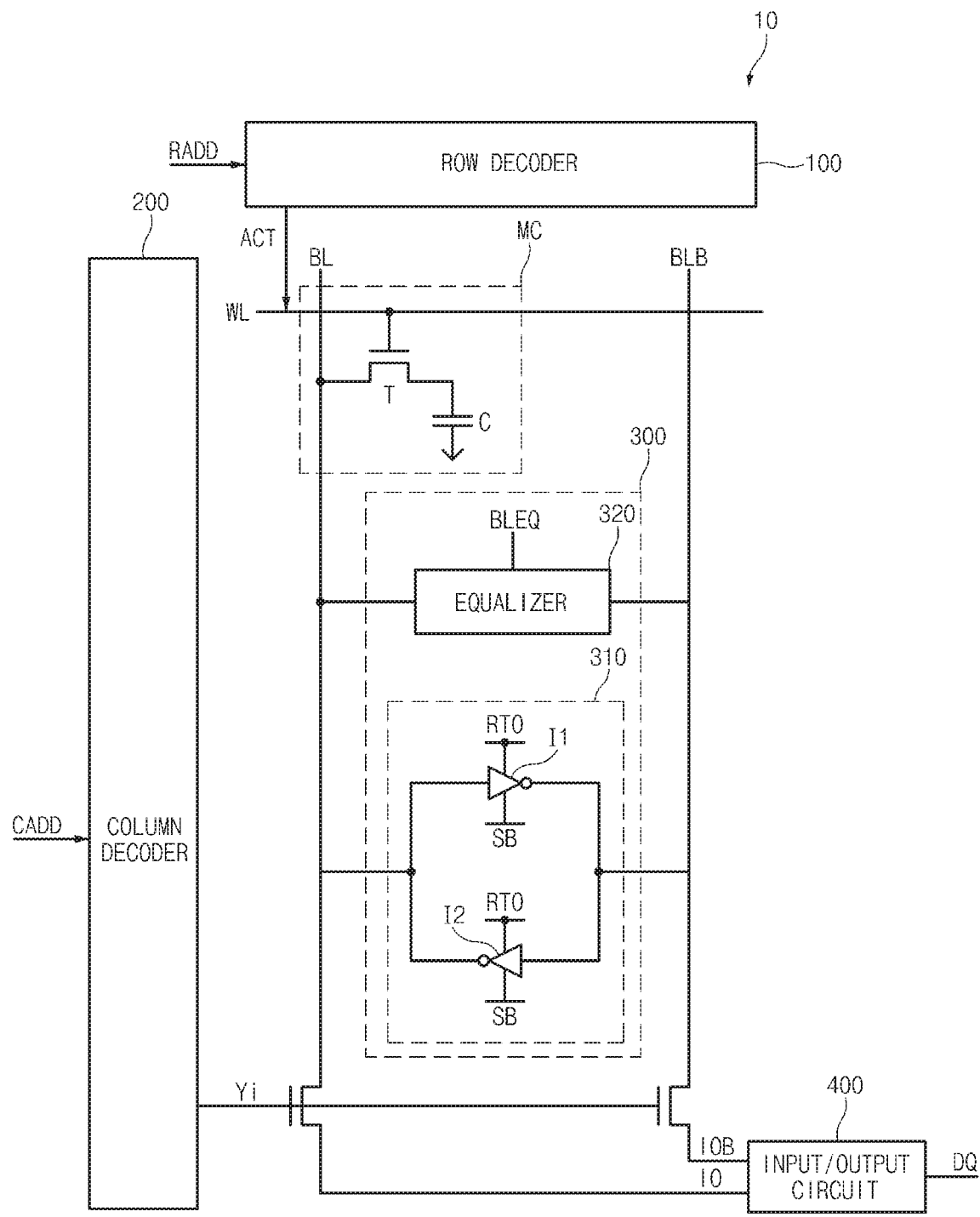
FIG. 1 is a configuration diagram of a semiconductor device according to an embodiment.

FIG. 1 is a configuration diagram of a semiconductor device 10 according to an embodiment.

Referring to FIG. 1, the semiconductor device 10 includes a memory cell MC, a row decoder (word line selector) 100, a column decoder (bit line selector) 200, a bit line sense amplifier 300 and an input and output (input/output) circuit 400.

The memory cell MC includes a cell transistor T and a cell capacitor C, and may be arranged at the intersection between a bit line BL or bit line bar BLB and a word line WL.

The row decoder 100 generates an active signal ACT for selecting one of a plurality of word lines WL based on a row address RADD transmitted from a central controller (not illustrated). The active signal ACT may include a common active signal ACT_RW, a write active signal ACT_W and a read active signal ACT_R. That is, the row decoder 100 may not only generate the common active signal ACT_RW which is usually used, but also generate the write active signal ACT_W during a write operation or generate the read active signal ACT_R during a read operation.

The row decoder 100 may select one of the plurality of word lines by decoding a row address RADD. Thus, the cell transistor T is turned on to transfer the potential of the cell capacitor C to the bit lines BL and BLB.

The column decoder 200 generates a column select signal Yi for selecting one or more bit lines among the plurality of bit lines (that is, pairs of bit lines BL and bit line bars BLB), based on a column address CADD transmitted from the central controller (not illustrated). The column decoder 200 may select one or more of the plurality of bit lines by decoding the column address CADD. The column select signal Yi may be enabled to couple the bit lines BL and BLB and input/output lines IO and IOB. During a read operation, the potentials of the bit lines BL and BLB are transferred to the input/output lines IO and IOB, and during a write operation, the potentials of the input/output lines IO and IOB are transferred to the bit lines BL and BLB.

In a present embodiment, it has been described that the row address RADD and the column address CADD are separately inputted from the central controller. However, the row address RADD and the column address CADD may be inputted as an integrated address. In this case, the semiconductor device may separate the input address into the row address RADD and the column address CADD, and transmit the row address RADD and the column address CADD to the row decoder 100 and the column decoder 200, respectively.

The bit line sense amplifier 300 is coupled between the bit line BL and the bit line bar BLB, and senses and amplifies a potential difference between the bit line BL and the bit line bar BLB.

The bit line sense amplifier 300 may include an amplifier 310 and an equalizer 320.

The operation of the amplifier 310 may be performed as follows. First, when the word line WL is activated to select the memory cell MC, the cell transistor T is turned on, and charge sharing occurs between the bit line BL and the cell capacitor C. Such charge sharing causes a potential difference between the bit line BL and the bit line bar BLB. The amplifier 310 may amplify the potential difference between the bit line BL and the bit line bar BLB, using cross-coupled inverters I1 and I2 which are driven through a pull-up power line RTO and a pull-down power line SB. The pull-up power line RTO and the pull-down power line SB correspond to a sense amplifier enable signal (SAEN).

The equalizer 320 may equalize the voltages of the bit line/bit line bar BL and BLB to a precharge voltage VBLP while an equalizing signal BLEQ is enabled.

The input/output circuit 400 relays a data DQ signal between the central controller and the semiconductor device 10. That is, the input/output circuit 400 outputs the potentials of the input/output lines IO and IOB as the data DQ signal to the central controller during a read operation. The input/output circuit 400 drives the input/output lines IO and IOB in response to the data DQ signal transmitted from the central controller during a write operation. The input/output circuit 400 may include an output buffer (not illustrated) for storing the potentials of the input/output lines IO and IOB and a write driver (not illustrated) for driving the input/output lines IO and IOB in response to the data DQ signal.

Figure 2:
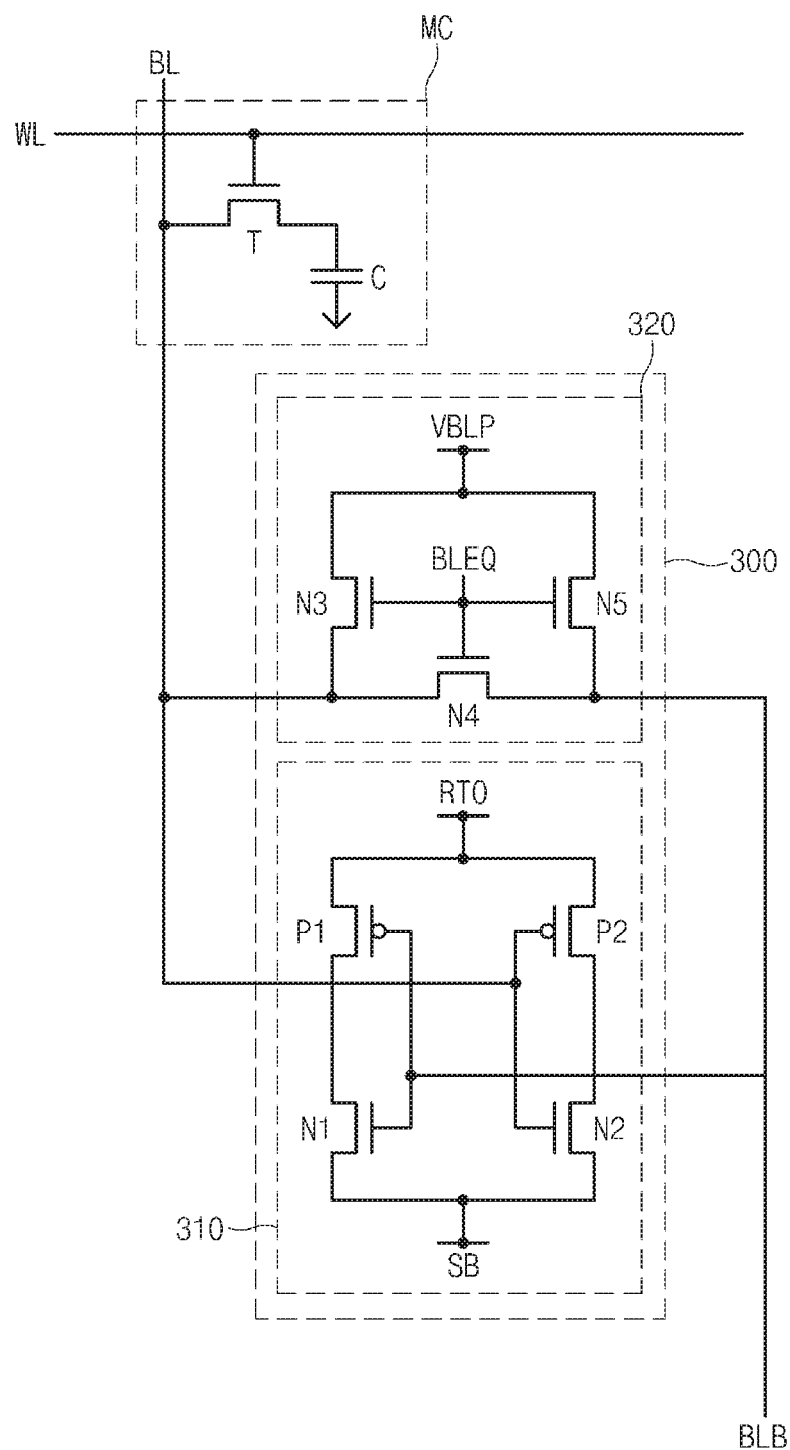
FIG. 2 is a circuit diagram of a memory cell and a bit line sense amplifier of FIG. 1.

FIG. 2 is a circuit diagram of the memory cell MC and the bit line sense amplifier 300 of FIG. 1.

When the memory cell MC is selected, the cell transistor T of the selected memory cell MC is turned on. Thus, the cell capacitor C of the selected memory cell MC and the bit line BL are electrically coupled to each other. Thus, charge exchange may occur between the cell capacitor C and the bit line BL, thereby changing the voltage of the bit line BL.

Before the memory cell MC is selected, the voltages of the bit line/bit line bar BL/BLB may be retained at the precharge voltage VBLP by the equalizer 320. Therefore, a potential difference may occur between the bit line BL and the bit line bar BLB from a point of time that the memory cell MC was selected. When the data of the memory cell MC is high data, the voltage of the bit line BL may rise, and when the data of the memory cell MC is low data, the voltage of the bit line BL may fall.

The amplifier 310 may amplify the potential difference between the bit line/bit line bar BL and BLB when a pull-up voltage terminal RTO and a pull-down voltage terminal SB are activated. That is, after the word line WL was activated and charge sharing occurred between the cell capacitor C and the bit line BL, the pull-up voltage terminal RTO and the pull-down voltage terminal SB of the amplifier 310 are enabled to amplify the potential difference between the bit line/bit line bar BL and BLB.

The amplifier 310 includes PMOS transistors P1 and P2 and NMOS transistors N1 and N2. The PMOS transistor P1 and the NMOS transistor N1 are coupled in series between the pull-up voltage terminal RTO and the pull-down voltage terminal SB, and the common gate thereof is coupled the bit line bar BLB. The PMOS transistor P2 and the NMOS transistor N2 are coupled in series between the pull-up voltage terminal RTO and the pull-down voltage terminal SB, and the common gate thereof is coupled the bit line BL.

The case in which data '1' is stored in the cell capacitor C is exemplified to describe the operation of the amplifier 310. The charge sharing between the cell capacitor C and the bit line BL slightly raises the potential of the bit line BL. Thus, electricity is conducted to the NMOS transistor N2 having the gate coupled to the bit line BL, thereby pull-down driving the potential of the bit line bar BLB to the voltage of the pull-down voltage terminal SB.

When the bit line bar BLB is pull-down driven, electricity is conducted to the PMOS transistor P1 having the gate coupled to the bit line bar BLB, thereby pull-up driving the potential of the bit line BL to the voltage of the pull-up voltage terminal RTO.

That is, although the cell capacitor C is slightly charged, the potentials of the bit line BL and the bit line bar BLB may be amplified to the potential of the pull-up voltage terminal RTO and the potential of the pull-down voltage terminal SB by the amplifier 310.

The equalizer 320 may retain the voltages of the bit line BL and the bit line bar BLB at the precharge voltage VBLP during the precharge period in which the data of the bit line is not sensed and amplified.

The equalizer 320 may include transistors N3 to N5. The transistors N3 to N5 may be turned on or off in response to an equalizing signal BLEQ. The equalizing signal BLEQ may be enabled at the period in which the data of the bit line is not sensed and amplified. That is, when the equalizing signal BLEQ is enabled at the period in which the data of the bit line is not sensed and amplified, electricity is conducted to the transistors N3 to N5, thereby retaining the voltages of the bit line BL and the bit line bar BLB at the precharge voltage VBLP.

Figure 3A:
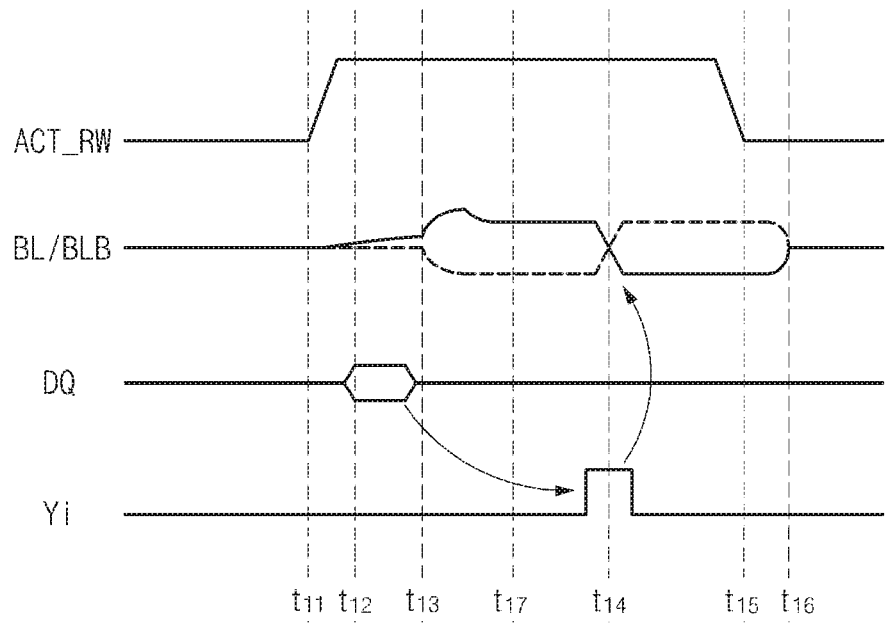
FIGS. 3A and 3B are timing diagrams of signals during a write operation according to a present embodiment.
Figure 3B:
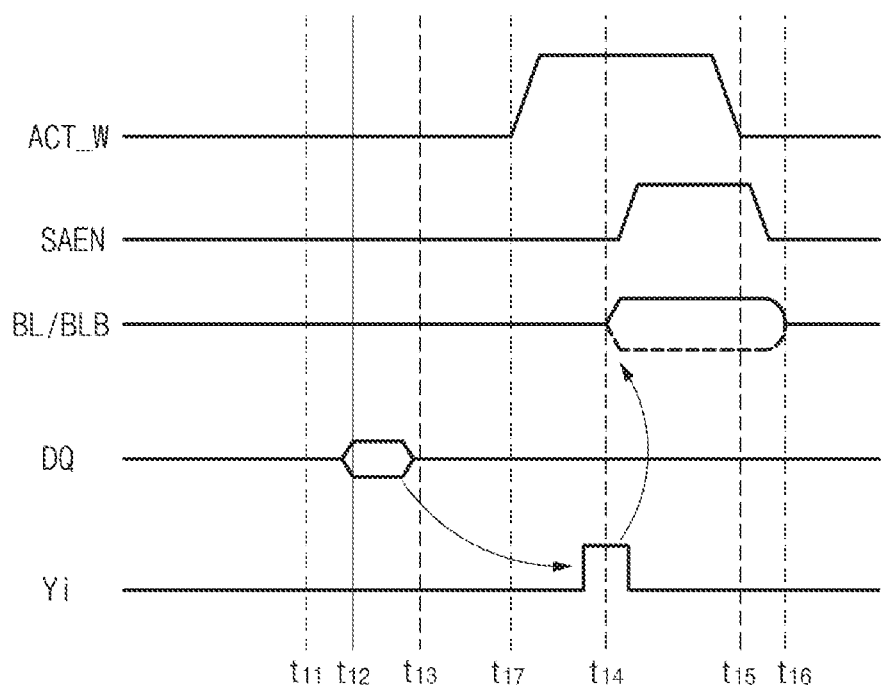

FIGS. 3A and 3B are timing diagrams of the signals during the write operation according to a present embodiment. FIG. 3A illustrates that the same common active signal ACT_RW is used during the read operation and the write operation, and FIG. 3B illustrates that the write active signal ACT_W for the write operation is separately present.

Referring to FIG. 3A, the row decoder 100 enables the common active signal ACT_RW for activating the word line WL at $t_{11}$.

Then, the potential of the bit line BL becomes slightly higher than the potential of the bit line bar BLB. This is because, when the word line WL is activated, the cell transistor T is turned on to cause charge sharing between the cell capacitor C and the bit line BL.

FIGS. 3A and 3B are based on the assumption that logic high data is stored in the memory cell MC. However, the scopes of the embodiments are not limited thereto, but logic low data may be stored in the memory cell MC. In this case, the potential of the bit line BL becomes slightly lower than the potential of the bit line bar BLB.

At $t_{12}$, the data DQ signal is inputted.

At $t_{13}$, the bit line sense amplifier 300 is driven. For example, a pull-up driving voltage and a pull-down driving voltage may be applied to the pull-up power line RTO and the pull-down power line SB of the bit line sense amplifier 300, respectively, at $t_{13}$. Thus, the potential difference between the bit line BL and the bit line bar BLB is amplified.

FIGS. 3A and 3B illustrate that the potential difference between the bit line BL and the bit line bar BLB increases at $t_{13}$, and the potential of the bit line BL slightly falls after a predetermined time. This is because an over driving voltage was applied to the pull-up power line RTO at $t_{13}$, and a voltage having a lower level than the over driving voltage was applied to the pull-up power line RTO after a predetermined time has elapsed from $t_{13}$. The application of the over driving voltage is only an example, and may be omitted.

At $t_{14}$, the column select signal Yi is inputted. Thus, the potentials of the bit line BL and the bit line bar BLB may be reversed. FIG. 3A is based on the supposition that a write command for logic low data is applied while logic high data is stored in the memory cell MC.

At $t_{15}$, the row decoder 100 disables the common active signal ACT_RW.

At $t_{16}$, the bit line sense amplifier 300 sets the potentials of the bit line BL and the bit line bar BLB to the precharge voltage VBLP. For example, when the equalizing signal BLEQ for the equalizer 320 of the bit line sense amplifier 300 is enabled in response to a precharge command, the equalizer 320 sets the potentials of the bit line BL and the bit line bar BLB to the precharge voltage VBLP.

Referring to FIG. 3A, the command active signal ACT_RW is applied to sense and amplify the potentials of the bit line BL and the bit line bar BLB at $t_{11}$, and the column select signal Yi is applied at $t_{14}$. Thus, the potentials of the bit line BL and the bit line bar BLB are unnecessarily sensed and amplified. Furthermore, when the data stored in the memory cell MC is different from data which is intended to be written by a write operation, a large amount of current may be consumed to reverse the potentials of the bit line BL and the bit line bar BLB.

FIG. 3B is a timing diagram of the signals when the write active signal ACT_W only for the write operation is used.

Referring to FIG. 3B, the data DQ signal is applied at $t_{12}$.

At $t_{17}$, the write active signal ACT_W is enabled. That is, the data DQ signal is applied before the write active signal ACT_W is applied.

At $t_{14}$, the column select signal Yi is enabled. Thus, the data DQ signal is transmitted to the bit line BL and the bit line bar BLB.

The subsequent operations are performed in the same manner as FIG. 3A. That is, the row decoder 100 disables the write active signal ACT_W at $t_{15}$. Then, the bit line sense amplifier 300 sets the potentials of the bit line BL and the bit line bar BLB to the precharge voltage VBLP at $t_{16}$.

Referring to FIGS. 3A and 3B, the period $t_{17}$~$t_{15}$ in which the write active signal ACT_W is enabled is shorter than the period $t_{11}$~$t_{15}$ in which the common active signal ACT_RW is enabled. Thus, it may be possible to reduce a write recovery time required from the point of time that the write command is applied to the point of time that the precharge command can be applied.

Furthermore, before the column select signal Yi is applied, the bit line sense amplifier 300 may not unnecessarily sense and amplify the potentials of the bit line BL and the bit line bar BLB. Thus, the current consumption is reduced.

Furthermore, since the bit line sense amplifier does not sense and amplify the potentials of the bit line BL and the bit line bar BLB before the column select signal Yi is applied, the potentials of the bit line BL and the bit line bar BLB do not need to be reversed, even when the data stored in the memory cell MC is different from the data which is to be written by the write operation. Therefore, the current consumption can be reduced, compared to when the common active signal ACT_RW is used.

Figure 4A:
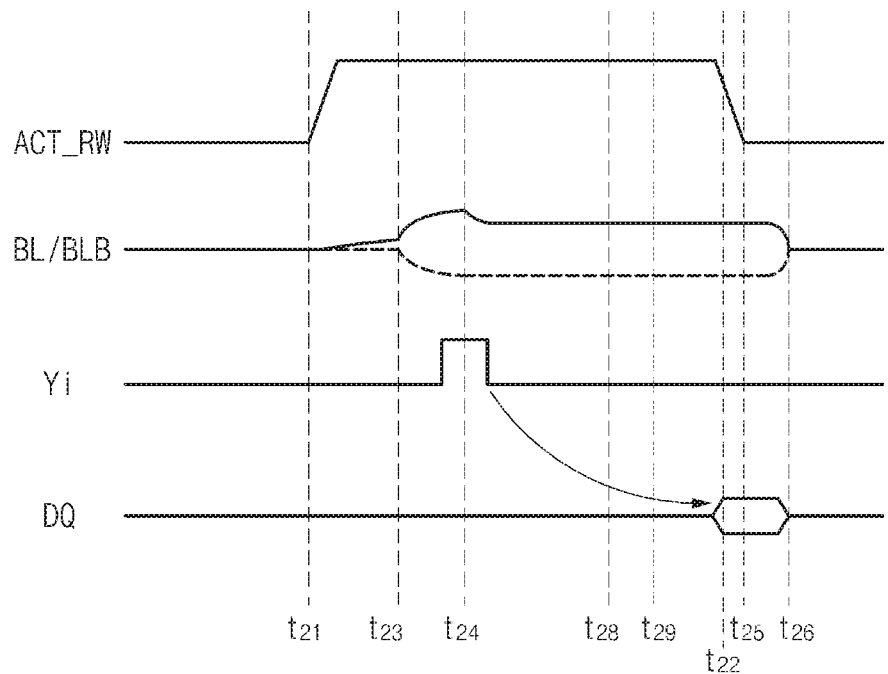
FIGS. 4A and 4B are timing diagrams of signals during a read operation according to a present embodiment.
Figure 4B:
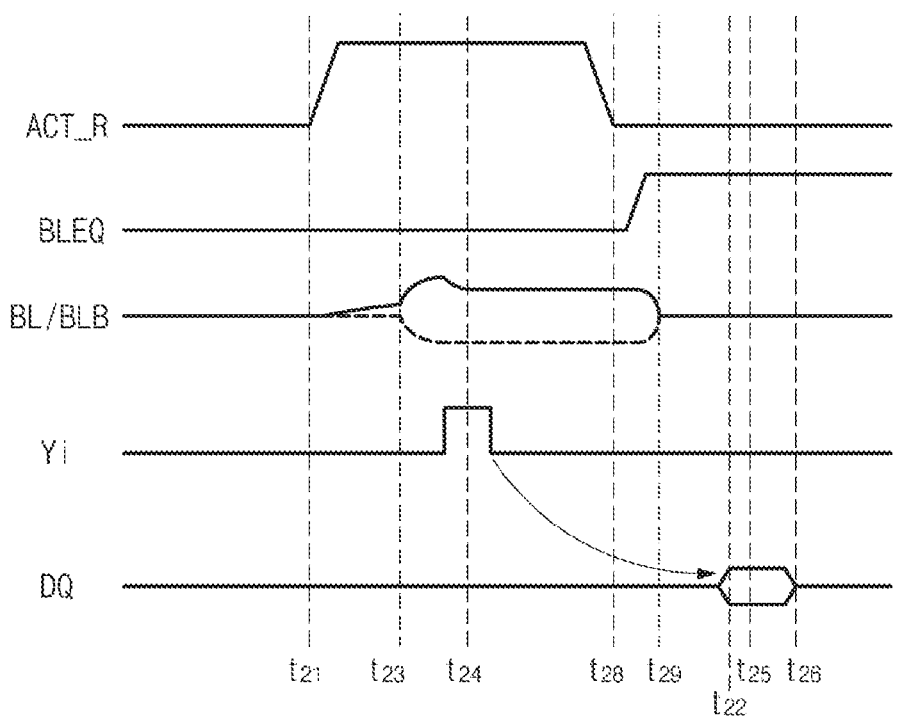

FIGS. 4A and 4B are timing diagrams of the signals during the read operation according to a present embodiment. FIG. 4A illustrates that the same common active signal ACT_RW is used during the read operation and the write operation, and FIG. 4B illustrates that the read active signal ACT_R for the read operation is separately present.

Referring to FIG. 4A, the row decoder 100 enables the common active signal ACT_RW for activating the word line WL at $t_{21}$.

Then, the potential of the bit line BL becomes slightly higher than the potential of the bit line bar BLB. This is because, when the word line WL is activated, the cell transistor T is turned on to cause charge sharing between the cell capacitor C and the bit line BL.

FIGS. 4A and 4B are based on the assumption that logic high data is stored in the memory cell MC, as in FIGS. 3A and 3B. However, the scopes of the present embodiments are not limited thereto, but logic low data may be stored in the memory cell MC. In this case, the potential of the bit line BL becomes slightly lower than the potential of the bit line bar BLB.

At $t_{23}$, the bit line sense amplifier 300 is driven. For example, the pull-up driving voltage and the pull-down driving voltage may be applied to the pull-up power line RTO and the pull-down power line SB of the bit line sense amplifier 300, respectively, at $t_{23}$. Thus, the potential difference between the bit line BL and the bit line bar BLB are amplified.

FIGS. 4A and 4B illustrate that the potential difference between the bit line BL and the bit line bar BLB increases at $t_{23}$, and the potential of the bit line BL slightly falls after a predetermined time. This is because the over driving voltage was applied to the pull-up power line RTO at $t_{23}$ and a voltage having a lower level than the over driving voltage was applied to the pull-up power line RTO after a predetermined time from $t_{23}$. The application of the over driving voltage is only an example, and may be omitted.

At $t_{24}$, the column select signal Yi is inputted.

Thus, the data DQ signal is outputted at $t_{22}$.

At $t_{25}$, the row decoder 100 disables the common active signal ACT_RW.

At $t_{26}$, the bit line sense amplifier 300 sets the potentials of the bit line BL and the bit line bar BLB to the precharge voltage VBLP. For example, when the equalizing signal BLEQ for the equalizer 320 of the bit line sense amplifier 300 is enabled in response to the precharge command, the equalizer 320 sets the potentials of the bit line BL and the bit line bar BLB to the precharge voltage VBLP.

Referring to FIGS. 3A and 4A, the common active signal ACT_RW is commonly used during the write operation and the read operation. Therefore, when the diagrams are illustrated so that $t_{11}$ of FIG. 3A coincides with $t_{21}$ of FIG. 4A, $t_{13}$ coincides with $t_{23}$, $t_{14}$ coincides with $t_{24}$, $t_{15}$ coincides with $t_{25}$, and $t_{16}$ coincides $t_{26}$.

That is, FIGS. 3A and 4A illustrate that the period $t_{11}$~$t_{15}$ in which the common active signal ACT_RW is enabled has the same length as the period $t_{21}$~$t_{25}$ in which the common active signal ACT_RW is enabled, the period from the time point $t_{11}$ that the common active signal ACT_RW is enabled to the time point $t_{13}$ that the bit line sense amplifier 300 is driven has the same length as the period from the time point $t_{21}$ that the common active signal ACT_RW is enabled to the time point $t_{23}$ that the bit line sense amplifier 300 is driven, and the period from the time point $t_{11}$ that the common active signal ACT_RW is enabled to the time point $t_{16}$ that the precharge command is inputted has the same length as the period from the time point $t_{21}$ that the common active signal ACT_RW is enabled to the time point $t_{26}$ that the precharge command is inputted.

Thus, as illustrated in FIG. 4A, when the common active signal ACT_RW is used during the read operation, the column select signal Yi is applied at $t_{24}$, and when the write command is applied, the common active signal ACT_RW needs to be maintained until the time point $t_{25}$ that the write operation is completed. Thus, while the common active signal ACT_RW is enabled, the data DQ signal is outputted.

FIG. 4B is a timing diagram of the signals when the read active signal ACT_R only for the read operation is used.

Referring to FIG. 4B, the respective signals from $t_{21}$ to $t_{24}$ have the same levels as those of FIG. 4A. That is, the read active signal ACT_R is enabled at $t_{21}$. Thus, charge sharing occurs between the cell capacitor C and the bit line/bit line bar BL/BLB, and thus causes a slight potential difference between the bit line BL and the bit line bar BLB.

At $t_{23}$, the bit line sense amplifier 300 is driven. For example, the pull-up driving voltage and the pull-down driving voltage may be applied to the pull-up power line RTO and the pull-down power line SB of the bit line sense amplifier 300, respectively, at $t_{23}$. Thus, the potential difference between the bit line BL and the bit line bar BLB is amplified. The over driving illustrated in FIG. 4B can be omitted.

At $t_{24}$, the column select signal Yi is enabled.

Thus, data indicated by the potentials of the bit line BL and the bit line bar BLB are transmitted as the data DQ signal at $t_{22}$.

FIG. 4B is different from FIG. 4A in that the read active signal ACT_R is disabled before the data DQ signal is generated, and the precharge command is applied to set the potentials of the bit line BL and the bit line bar BLB to the precharge voltage VBLP.

That is, at $t_{28}$, the row decoder 100 disables the read active signal ACT_R. Then, at $t_{29}$, the bit line sense amplifier 300 sets the potentials of the bit line BL and the bit line bar BLB to the precharge voltage VBLP. The time points $t_{28}$ and $t_{29}$ are earlier than the time point $t_{22}$ that the data DQ signal is outputted.

Referring to FIGS. 4A and 4B, the period $t_{21} \sim t_{28}$ in which the read active signal ACT_R is enabled is shorter than the period $t_{21} \sim t_{25}$ in which the common active signal ACT_RW is enabled, which makes it possible to reduce a time tRTP from the point of time that the read command is applied to the point of time that the precharge command can be applied. Thus, since the read operation can be rapidly performed, the operation speed of the semiconductor device 10 can be improved.

Furthermore, since the period $t_{21} \sim t_{28}$ in which the read active signal ACT_R is enabled becomes shorter than the period $t_{21} \sim t_{25}$ in which the common active signal ACT_RW is enabled, the current consumption per unit operation can be reduced.

Figure 5:
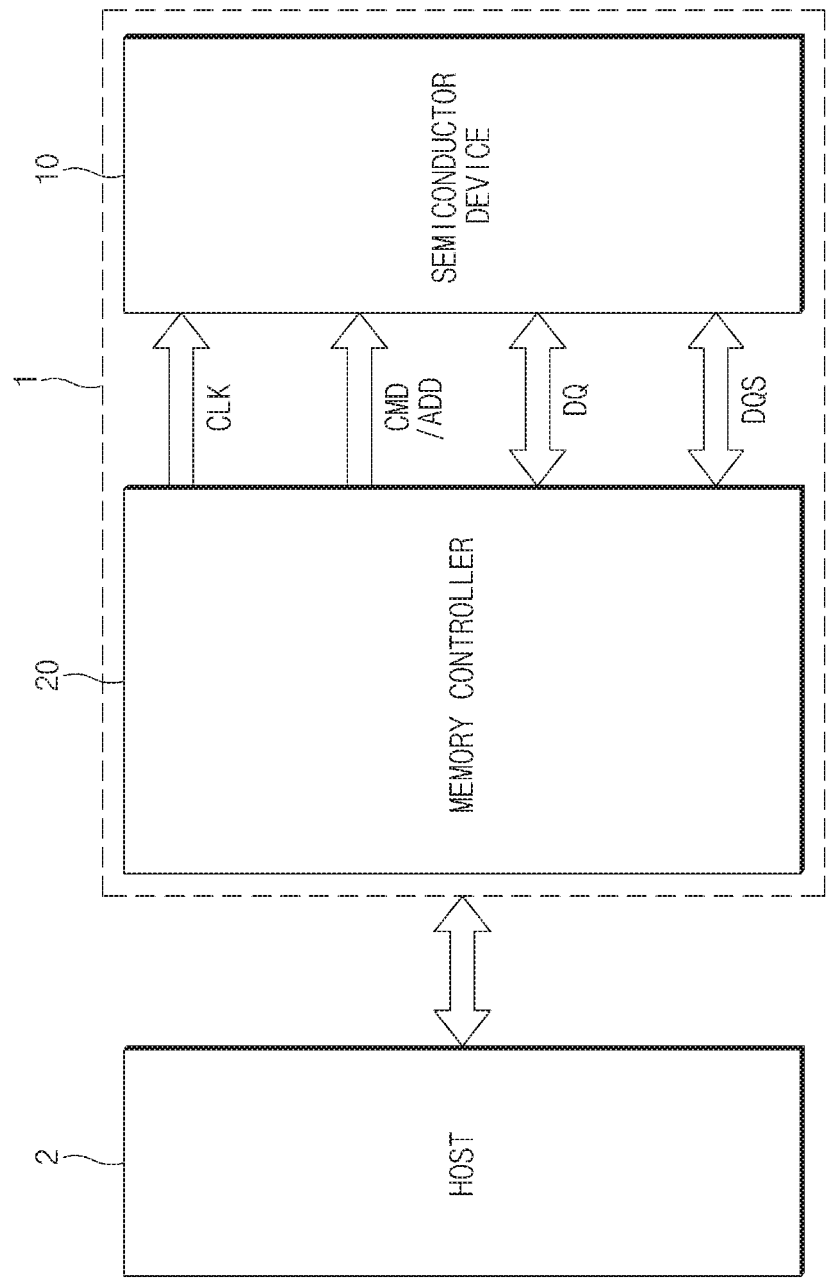
FIG. 5 is a diagram illustrating a host and a semiconductor system including a semiconductor device according to an embodiment.

FIG. 5 is a diagram illustrating a host 2 and a semiconductor system 1 including a semiconductor device 10 according to an embodiment.

As illustrated in FIG. 5, the semiconductor system 1 may include the semiconductor device 10 and a memory controller (central controller) 20. The semiconductor system 1 exchanges information with the host 2.

The host 2 may transmit a request and data to the memory controller 20 in order to access the semiconductor device 10. The host 2 may transmit data to the memory controller 20 in order to store the data in the semiconductor device 10. Furthermore, the host 2 may receive data outputted from the semiconductor device 10 through the memory controller 20. The memory controller 20 may provide data information, address information, memory setting information, a write request, a read request and the like to the semiconductor device 10 in response to the request, and control the semiconductor device 10 to perform a write or read operation. The memory controller 20 may relay communication between the host 2 and the semiconductor device 10. The memory controller 20 may receive the request and data from the host 2, generate data DQ, a data strobe signal DQS, a command signal CMD, a memory address ADD and a clock CLK, and provide the generated data and signals to the semiconductor device 10 in order to control the operation of the semiconductor device 10. The memory controller 20 may provide the data DQ and the data strobe signal DQS from the semiconductor device 10 to the host 2.

The memory controller 20 may control the semiconductor device 10 to separately generate the write active signal ACT_W and the read active signal ACT_R as illustrated in FIGS. 4 and 5.

For example, as illustrated in FIG. 4B, the memory controller 20 may first transmit the data DQ signal and then transmit the write command. Thus, the write active signal ACT_W may be enabled after the data DQ signal is inputted to the semiconductor device 10.

FIG. 5 illustrates that the host 2 and the memory controller 20 are physically separated from each other. However, the memory controller 20 may be included (embedded) in a processor such as CPU (Central Processing Unit), AP (Application Processor) or GPU (Graphic Processing Unit) of the host 2 or implemented as one chip with the processors in the form of SoC (System on Chip).

The semiconductor device 10 may include a plurality of memory banks, and store data DQ in a specific region of the memory banks, based on a memory address signal ADD. The semiconductor device 10 may perform a data transmission operation based on a command CMD, a memory address signal ADD and a data strobe signal DQS, which are received from the memory controller 20. The memory may transmit data stored in a specific region of the memory banks to the memory controller 20, based on the memory address signal ADD, the data DQ and the data strobe signal DQS.

According to the present embodiments, since only the components suitable for each of the read operation and the write operation are operated, the current consumption can be reduced.

Furthermore, the periods in which the read active signal and the write active signal are enabled can be shortened, compared with when the common active signal is used. Therefore, the information transmission speed can be improved.

While certain embodiments have been described above, it will be understood to those skilled in the art that the embodiments described are by way of example only. Accordingly, the semiconductor devices described herein should not be limited based on the described embodiments. Rather, the semiconductor devices described herein should only be limited in light of the claims that follow when taken in conjunction with the above description and accompanying drawings.

The configuration of active high or active low data to indicate an active state of a signal or circuit may differ depending on embodiments. Moreover, the configuration of transistors may be changed in order to implement the same function. That is, the PMOS transistor and the NMOS transistor may replace each other, and various transistors may be used as needed. Such a circuit modification has a large number of cases, and can be easily understood by those skilled in the art. Therefore, the enumeration thereof is omitted herein.

What is claimed is:
1. A semiconductor device comprising:
   a word line selector configured to generate a read active signal and a write active signal for selecting a word line, based on a row address, the read active signal being generated based on a read command and the write active signal being generated based on a write command;

a bit line selector configured to generate a column select signal for coupling bit lines and an input and output (input/output) line, based on a column address;

a bit line sense amplifier configured to sense and amplify the potential of the bit lines based on a sense amplifier enable signal; and an input/output circuit configured to drive the input/output line in response to a data (DQ) signal, or output a DQ signal corresponding to the potential of the input/output line, wherein the column select signal is enabled after the write active signal is enabled, and the sense amplifier enable signal is disabled during a period from a point of time that the write active signal is enabled to a point of time that the column select signal is enabled.

2. The semiconductor device of claim 1, wherein the bit line sense amplifier comprises:

an equalizer configured to apply a precharge voltage to the bit lines based on an equalizing signal; and an amplifier configured to sense and amplify the potential of the bit lines based on a sense amplifier enable signal.

3. The semiconductor device of claim 2, wherein after the read active signal transitions from an enabled state to a disabled state, the equalizing signal is enabled before the input/output circuit outputs the DQ signal corresponding to the potential of the input/output line.

4. The semiconductor device of claim 1, wherein the write active signal is enabled after the input/output circuit drove the input/output line in response to the DQ signal.

5. The semiconductor device of claim 1, wherein when the write active signal is enabled, the bit line sense amplifier starts to sense and amplify the potential of the bit lines after the column select signal is enabled.

6. The semiconductor device of claim 5, wherein the bit line sense amplifier does not sense or amplify the potential of the bit lines during a period from a point of time that the write active signal is enabled to a point of time that the column select signal is enabled.

7. The semiconductor device of claim 1, wherein the read active signal is disabled before the input/output circuit outputs the DQ signal corresponding to the potential of the input/output line.

8. The semiconductor device of claim 1, wherein after the read active signal transitions from an enabled state to a disabled state, a precharge operation is performed before the input/output circuit outputs the DQ signal corresponding to the potential of the input/output line.

\* \* \* \* \*